(12) United States Patent
Rombach et al.

(10) Patent No.: US 11,128,959 B2
(45) Date of Patent: Sep. 21, 2021

(54) MEMS MICROPHONE WITH IMPROVED PARTICLE FILTER

(71) Applicant: TDK Corporation, Tokyo (JP)

(72) Inventors: Pirmin Hermann Otto Rombach, Kongens Lyngby (DE); Dennis Mortensen, Frederiksberg C (DK); Jan Tue Ravnkilde, Denmark (DK); Kurt Rasmussen, Herlev (DK); Morten Ginnerup, Kongens Lyngby (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 16/630,050

(22) PCT Filed: Jul. 3, 2018

(86) PCT No.: PCT/EP2018/067942
§ 371 (c)(1),
(2) Date: Jan. 10, 2020

(87) PCT Pub. No.: WO2019/011720
PCT Pub. Date: Jan. 17, 2019

(65) Prior Publication Data
US 2020/0169818 A1    May 28, 2020

(30) Foreign Application Priority Data

Jul. 10, 2017   (DE) .......................... 102017115405.1

(51) Int. Cl.
*H04R 9/08*   (2006.01)
*H04R 11/04*   (2006.01)
(Continued)

(52) U.S. Cl.
CPC ........... *H04R 19/04* (2013.01); *B81B 7/0061* (2013.01); *H04R 1/04* (2013.01); *B81B 2201/0257* (2013.01); *H04R 2201/003* (2013.01)

(58) Field of Classification Search
CPC .......... H04R 19/04; H04R 1/04; B81B 7/0061
See application file for complete search history.

(56) References Cited

U.S. PATENT DOCUMENTS 6,088,463 A   7/2000 Rombach
7,221,767 B2   5/2007 Mullenborn
(Continued)

FOREIGN PATENT DOCUMENTS

EP   2566183 A1   3/2013
KR   101303954 B1   9/2013
WO   WO 2011/132062 A1   10/2011

OTHER PUBLICATIONS

International Search Report corresponding to International Patent Application No. PCT/EP2018/067942, dated Sep. 27, 2018 (4 pages).

(Continued)

*Primary Examiner* — Simon King
(74) *Attorney, Agent, or Firm* — Nixon Peabody LLP (57) ABSTRACT

A MEMS microphone including a carrier board and a MEMS chip mounted thereon over a sound opening. A filter chip includes a bulk material with an aperture covered and closed by a mesh. The mesh includes a layer of the filter chip with parallel through-going first holes structured in the layer. The filter chip is arranged in or on the carrier board such that the mesh covers the sound opening.

12 Claims, 5 Drawing Sheets

(51) Int. Cl.
  *H04R 17/02* (2006.01)
  *H04R 19/04* (2006.01)
  *H04R 21/02* (2006.01)
  *B81B 7/00* (2006.01)
  *H04R 1/04* (2006.01)

(56) References Cited

U.S. PATENT DOCUMENTS

| | | | |
|---|---|---|---|
| 7,974,430 B2 | 7/2011 | Izuchi | |
| 8,447,057 B2 | 5/2013 | Goida | |
| 8,724,841 B2 | 5/2014 | Bright | |
| 9,661,411 B1* | 5/2017 | Han | H04R 19/04 |
| 9,769,554 B2 | 9/2017 | Brioschi | |
| 2010/0208930 A1 | 8/2010 | Kopnov | |
| 2010/0284553 A1* | 11/2010 | Conti | H04R 19/005 |
| | | | 381/174 |
| 2012/0033831 A1* | 2/2012 | Leitner | H04R 1/222 |
| | | | 381/98 |
| 2012/0087521 A1 | 4/2012 | Delaus | |
| 2012/0237073 A1* | 9/2012 | Goida | H04R 1/02 |
| | | | 381/361 |
| 2013/0140655 A1* | 6/2013 | Yeh | H01L 21/56 |
| | | | 257/416 |
| 2014/0044297 A1* | 2/2014 | Loeppert | H04R 1/08 |
| | | | 381/355 |
| 2014/0091406 A1 | 4/2014 | Harney | |
| 2014/0197501 A1* | 7/2014 | Dehe | B81B 3/0072 |
| | | | 257/416 |
| 2014/0299948 A1 | 10/2014 | Wang | |
| 2015/0060955 A1* | 3/2015 | Chen | H04R 19/04 |
| | | | 257/254 |
| 2015/0237431 A1 | 8/2015 | Jeziorek | |
| 2015/0304753 A1 | 10/2015 | Loeppert | |
| 2015/0358704 A1* | 12/2015 | Slotte | H04R 1/04 |
| | | | 381/332 |
| 2016/0261941 A1* | 9/2016 | Brioschi | H04R 19/04 |
| 2018/0215609 A1* | 8/2018 | Agashe | B81C 1/00285 |
| 2020/0039816 A1* | 2/2020 | Zou | B81B 7/0061 |
| 2020/0039817 A1* | 2/2020 | Zou | H04R 1/04 |
| 2020/0137501 A1* | 4/2020 | Piechocinski | H04R 19/005 |

OTHER PUBLICATIONS

Written Opinion of International Searching Authority corresponding to International Patent Application No. PCT/EP2018/067942, dated Sep. 27, 2018 (6 pages).

Yang X. et al.; "Micromachined membrane particle filters"; Micro Electro Mechanical Systems; MEMS 98; Proceedings of Eleventh Annual International Workshop; Heidelberg; Germany; Jan. 25-29; 1998; Jan. 5; 1998; pp. 137-142; XP010270238 (6 pages).

* cited by examiner

MEMS MICROPHONE WITH IMPROVED PARTICLE FILTER

CROSS-REFERENCE TO RELATED APPLICATIONS

This application is a U.S. National Stage of International Application No. PCT/EP2018/067942, filed Jul. 3, 2018, which claims the benefit of Germany Patent Application No. 102017115405.1, filed Jul. 10, 2017, both of which are incorporated herein by reference in their entireties.

High-end MEMS microphones usually have backplate holes with diameters of 5-15 µm being relatively large compared to the air gap size of typically 2-4 µm, as this improves the microphones Signal-to-Noise Ratio (SNR). Unfortunately, this allows particles to have access to the air-gap, if one of their dimensions is in the range of a few µm and the other dimensions in the range of 10 µm. As a result this will compromise the acoustic performance of the microphone, such as sensitivity, noise and THD (THD=Total Harmonic Distortion). Over time particles will be accumulated in the air-gap and finally make the microphone completely useless.

Today, in order to avoid larger particles to enter the microphone sound port, a filter is placed outside the microphone in the sound channel that is typically realized as a sound opening in a carrier board the microphone is mounted on. The filter detains larger particles with dimensions of many 10 µm, but also adds to the resistance in the sound path and thus results in a SNR reduction. This type of filters has the disadvantage that it will not detain small particles of a few µm from reaching the backplate. Further, meshes with such holes add to the resistance of the sound path and compromise the performance of the microphone.

Meshes with pore/hole sizes of 2-5 µm that are thin enough to not add too much to the resistance are not available and also would be difficult to handle/apply.

Some microphone constructions with integrated dust mesh can be found:

EP 2 566 183 A1 shows a textile mesh with pore size of many 10 µm diameter.

U.S. Pat. No. 6,088,463 A shows a unspecific filter on top of a sound port. U.S. Pat. No. 7,221,767 B2 shows a unspecific filter on top of a sound port of MEMS chip. U.S. Pat. No. 7,974,430 B2 shows a classical ECM microphone with a dust mesh with holes of 0.1 mm diameter applied inside the metal cap. U.S. Pat. No. 8,447,057 B2 uses the top metal layer of the microphone PCB to form a dust grid. Holes in this type of technology cannot be made in the µm range, but many 10 µm range only. The disclosed holes in the backplate have diameters from 2 µm to 80 µm. However, holes having a diameter of about 2 µm in a backplate will compromise the SNR performance of the microphone drastically.

US 2014/0091406 A1 discloses a filter as a sheet on top of the ceramic layer in a kind of a DIL package (Dual in-line package) made of acoustic fabric. Here, hole sizes are typically in the range of 10 µm diameter and larger, and of a thickness of >10 µm.

It is common for all known microphones that the thickness/hole length of the additional filter or dust grid is above 2 µm and thus, will add too much acoustic resistance to the system and reduce the SNR performance.

Hence, it is an object of the present invention to provide a MEMS device and preferably a MEMS microphone that has an improved particle filter that does not worsen the mechanical and electrical device performance too much. A further object is to provide a filter for the sound channel of the microphone that is easy to manufacture and that detains smaller particles than known dust grids.

These and other objects are met by a MEMS microphone according to claim 1. Embodiments of the invention are given by dependent claims.

To overcome the above mentioned problem of known filters of adding a too large acoustic series resistor in the sound channel, that will have a negative impact onto the microphone SNR, and at the same time to avoid small particles to enter the air-gap, a specific filter chip with a mesh is integrated in or on the carrier board of the microphone in front of the MEMS chip. The filter chip is arranged in the sound channel.

In a preferred arrangement the filter chip spans over the entire diameter of a sound opening in the carrier board and "closes" it. Any of sound, air or particles has to pass through the mesh or will be prevented by the mesh from passing.

The filter chip may be a ceramic chip or a chip of a crystalline material. In a thin layer applied on a surface of the filter chip the mesh is formed by structuring holes in said layer. The filter chip has a through-going aperture formed and located under the mesh such that the mesh spans over and closes the aperture. The bulk material of the filter chip provides a clamping frame for the mesh. So, even very thin meshes can be provided that could not be handled alone or without that frame. Nevertheless the filter chip provides sufficient mechanical stability for thin meshes.

Using semiconductor/MEMS technology allows the fabrication of extremely thin layers for the mesh with small holes that will only add marginally to the acoustic resistance and at the same time prevent small particles to enter the air-gap between membrane and backplate of the MEMS chip. Meshes with pore/hole sizes of 3-5 µm that are thin enough to not add too much to the acoustic resistance of the filter have not been available before as it has been difficult to handle or apply such meshes.

In a preferred embodiment the mesh is structured from a layer having a thickness of less than 2 µm. In such a layer holes having diameters of 2 to 50 µm can be formed by etching for example. The layer may be formed of any material that provides sufficient machical strength to a thin mesh of desired low thickness. Preferred are materials as used in semiconductor processes that can easily be structured like oxides or nitrides. But it is also possible to manufacture the mesh of a metal. Especially metals that can be sputtered or electroplated like Al, Cu and Ni can be preferably used, but also other metals are possible.

However it is possible make the layer and hence the mesh as thin as 0.1 µm and the holes small e.g. having a diameter from 0.5 µm to 20 µm or more preferably from 0.5 µm to 2 µm. With such dimensions of the mesh small particles of a few micro meter in size are detained from passing the mesh and hence, from reaching the backplate or the gap between backplate and membrane.

In addition, a known sound port consisting of only one hole (i.e. the sound opening) in the carrier board can be replaced by the mesh having several small holes of about 50 µm diameter or less. The small holes formed in parallel will have the same acoustic resistance as the single sound port hole.

According to another embodiment, the filter chip comprises a second mesh structured in a second layer arranged on a surface thereof opposite to the first mesh. The second mesh is spanning over the aperture with parallel through-going second holes holes forming the second mesh. The diameter of the first holes in the first mesh that faces the backplate is smaller than the diameter of the second holes facing away from the backplate.

By this a dual stage filter is formed. This filter may have a first side with a µm pore size and a second side with a 10 µm pore size, both may be formed the same way by structuring a respective thin layer of about 1 µm thickness.

Another two-stage filter can be provided by a grid that is structured in a layer of the carrier board and that is spanning over the soundhole at a position below the filter chip facing away from the MEMS chip. The grid comprises third holes having a diameter greater than the diameter of first and second holes.

A three-stage filter can be provided by combining a grid integrated in the carrier board with a filter chip having a first and a second mesh. The diameter of the holes decreases in the direction to the MEMS chip and hence decreases from the grid to second and first mesh.

In general the pore shape and size can be optimized for a minimum acoustic resistance and maximum filter performance. A multi-stage filter can filter out particles with higher reliability even when starting with a large hole diameter in the grid or in the second mesh.

In an embodiment, the first diameter is between 0.5 µm and 5 µm, the second diameter is between 5 µm and 20 µm, and the thickness of the first mesh is between 0.10 µm and 0.5 µm, and the thickness of the second mesh is between 0.3 and 5 µm.

The filter chip can be arranged anywhere in the sound channel. Preferably it is arranged to close the sound opening in the carrier board. There, it may be at least partly buried and arranged in a recess of the surface of the carrier board. Alternatively, the filter chip is arranged on the top surface of the carrier board that is between carrier board and MEMS chip. In a further alternative, the filter chip may be arranged on, near or buried in the surface of the carrier board opposite to the MEMS chip.

Preferably, the recess in the MEMS chip, the aperture of the filter chip, the sound opening as well as first and second mesh are arranged coaxially and hence in a line to enable a straight sound channel with a low acoustic series resistance.

On the surface of the mesh, a metal layer can be deposited that can be used as an ESD protection shield. Then, the metal layer needs being electrically connected to a ground connection of the carrier board. For doing this the filter chip can be mounted in or on the sound opening using conductive glue to connect the metal layer on the mesh and a respective contact area on the carrier board.

Such an additional metal layer will be a very simple add-on to the fabrication process of the filter chip and does not require substantial process effort.

Further, a hydrophobic coating can be deposited onto the surface of one of the meshes, preferably on the mesh that is next to the MEMS chip and has the smallest hole diameter. Such a coating prevents liquid water to enter into the microphone through the mesh.

In the following the invention will be explained in more detail with reference to preferred embodiments and the relating figures. The figures are schematically only for better understanding and not drawn to scale. Identical or equivalent parts are referenced by the same reference symbols.

Figure 1:
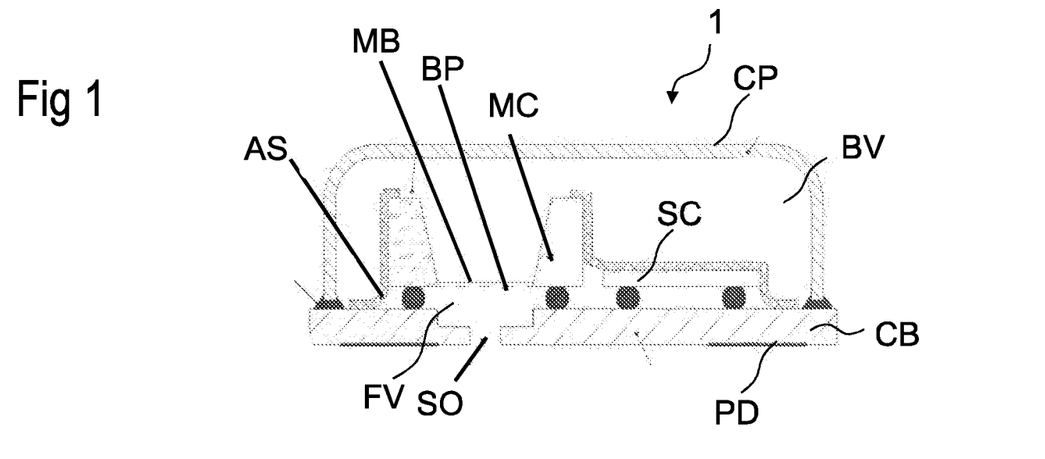
FIG. 1 shows in a cross sectional view a bottom port MEMS microphone of the state of the art with backplate directly exposed to ambient

FIG. 1 shows in a cross-sectional view a MEMS microphone according to the art. The microphone comprises a MEMS chip MC that is mounted on a carrier board CB such that membrane MB and back plate BP of the MEMS chip MC are facing a sound opening SO in the carrier board CB. Further, the MEMS microphone 1 comprise an ASIC SC that is a small semiconductor chip that supports and controls the function of the MEMS microphone 1.

The microphone chip MC and ASIC SC are arranged under a cap CP that is mounted on the top surface of the carrier board CB. An acoustic seal AS that may be a foil seals MEMS chip MC and ASIC SC to the surface of the carrier board CB to enclose there between a front volume FV. The MEMS chip MC has a recess over the membrane and the acoustic seal is removed over the recess to uncover membrane and back plate. Hence, between cap CP and acoustic seal/recess a back volume BV is enclosed.

On the bottom of the carrier board contact pads PD are formed that are electrically connected with the ASIC and in some cases with the MEMS microphone as well. These contact pads PD are used to connect the MEMS microphone 1 with an external circuitry and function as well for mounting the microphone into this circuitry.

The carrier board CB may have a multilayer structure and may be formed from an HTCC (high temperature co-fired ceramics) or FR4 to provide a high mechanical stability. Inside the multilayer structure one or more wiring layers may be arranged to connect contact pads of the MEMS chip or the ASIC with the contact pads PD on the bottom surface of the carrier board CB. By the wiring layer interconnection of MEMS chip MC and ASIC SC may be formed as well.

The cap CP, enclosing thereunder MEMS chip MC and ASIC SC, may be of a metal. But any other mechanically stable material is possible to form the cap CP. It is advantageous that the cap CP has at least a metal layer to provide a shielding of the microphone. In all cases the metal of the cap CP is connected with a ground pad on the carrier board that is connected with a ground contact pad on the bottom surface of the carrier board CB. Interconnection between cap CP and carrier board CB may be done by a conductive adhesive or soldering.

A MEMS microphone 1 shown in FIG. 1 is a specified embodiment but needs not to be embodied as shown. For better reference the following explanation of the invention starts from a microphone as shown in FIG. 1. The central idea of the invention refers to a new structure of the sound channel that is the total volume between sound opening SO and backplate BP. However, any other variation of the microphone design and package that does not directly refer to the central idea of the invention is regarded to be within the scope of the invention. For example only, the microphone chip MC may be mounted to the surface of the carrier board CB not only by a bump connection as shown in FIG. 1 but by any other connection method.

Figure 2:
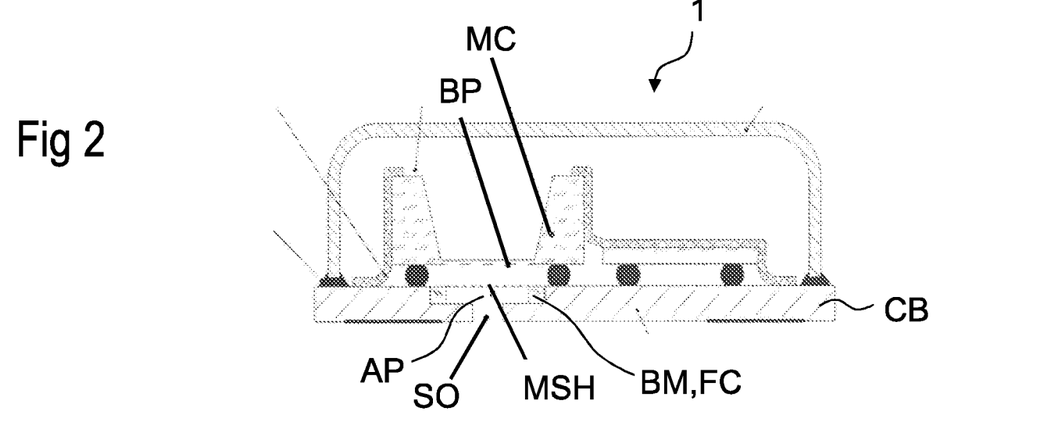
FIG. 2 shows in a cross sectional view a bottom port MEMS microphone of the state of the art with a filter chip integrated into carrier board

FIG. 2 shows, in the same cross-sectional view, a MEMS microphone 1 according to a first embodiment of the invention. To keep in line with FIG. 1 the same components of the microphone of FIG. 1 are depicted. The invention provides a filter chip FC that is arranged on the carrier board and, as shown in FIG. 2, buried in a recess on the top surface of the carrier board CB. The filter chip FC comprises a bulk material BM having an aperture AP that is covered and "closed" by a mesh MSH spanning over the aperture AP. "Closed" has to be understood that no other gap or opening besides the holes in the mesh remains and hence, no other access to the the aperture exist than the passage formed the holes in the mesh. The bulk material of the filter chip FC forms a clamping frame for the mesh MSH. The mesh comprises holes arranged in parallel and having all the same diameter of about 50 μm or less. Hence, the sound opening SO of the MEMS microphone 1 is closed by the mesh thereby detaining particles having a diameter greater than the diameter of the holes to reach the backplate and prevents any damage or disturbance by those particles.

The filter chip FC and the according mesh MSH may be of any shape. But it is advantageous that the mesh and the aperture have the same shape like the backplate to guarantee a maximum overlap. Preferable are round backplates and hence, round shaped meses. But it is possible too that the mesh may be of a smaller area than the backplate and the recess in the MEMS chip MC.

Figure 4:
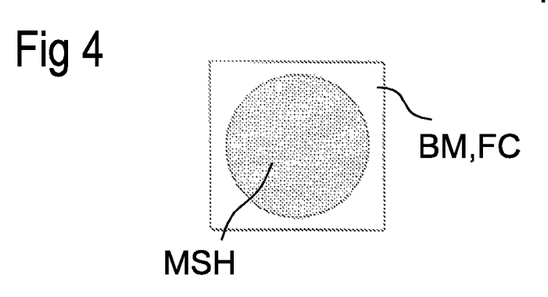
FIG. 4 shows in a top view a filter chip as can be used in the microphone of FIG. 2

FIG. 4 shows a possible shape of a filter chip FC that can be used in the microphone of FIG. 2 in a top view. The bulk material BM, and hence the filter chip FC, has a rectangular shape according to the shape of the recess in the MEMS chip and the shape of the backplate. The mesh MSH spans over an aperture AP having a round shape. If the backplate of the MEMS microphone would have a rectangular area the filter chip FC should have the same shape as the backplate.

Figure 3:
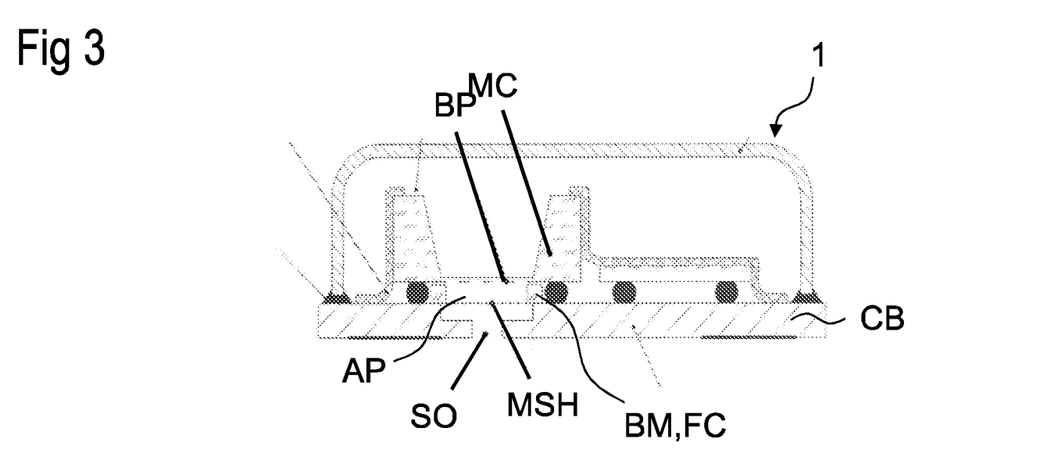
FIG. 3 shows in a cross sectional view a bottom port MEMS microphone of the state of the art with filter chip placed between carrier/HTCC and MEMS microphone chip

FIG. 3 shows in another cross-sectional view another arrangement of the inventive filter chip in an inventive MEMS microphone 1. Here, the filter chip FC is arranged and mounted on the top surface of the carrier board CB just below the MEMS chip MC. The filter chip FC has a shape and a dimension that is greater than that of the sound opening in the carrier board CB and hence totally covers the sound opening SO. The mesh MSH may be arranged on the bottom side of the filter chip FC as shown in the figure to ensure a gap to the backplate that is large enough. But it is also possible that the mesh is on the side of the filter chip FC that faces the backplate BP.

Figure 5:
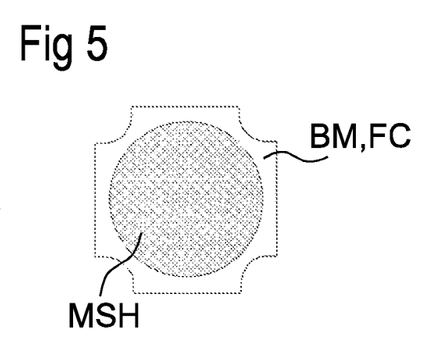
FIG. 5 shows in a top view a filter chip as can be used in the microphone of FIG. 3

FIG. 5 shows a possible shape of a filter chip that matches to the embodiment of FIG. 3. The filter chip FC has convex rounded corners that are matching to the bump connection of the filter chip FC to the carrier board CB. The bumps may be arranged in the concave parts/recesses of the filter chip FC.

Figure 6:
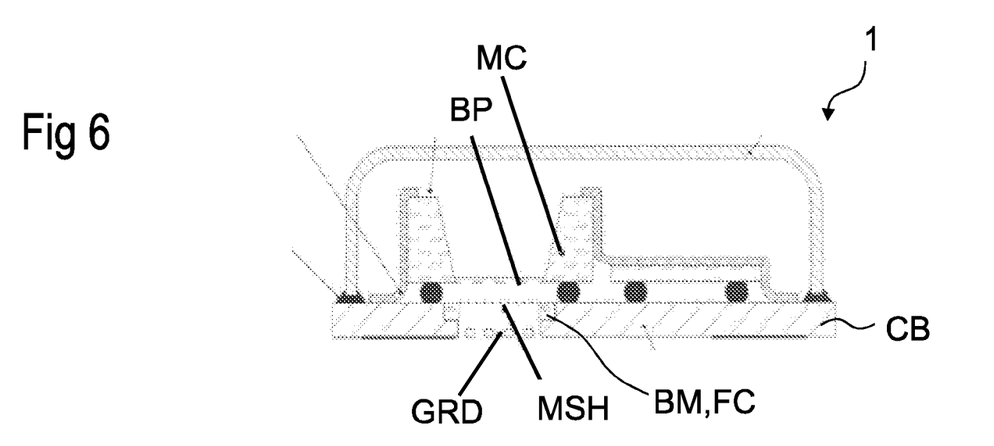
FIG. 6 shows a state of the art bottom port MEMS microphone with a filter chip and a rough grid integrated into the carrier board

FIG. 6 shows a further advanced embodiment of an MEMS microphone 1 according to the invention. Here, the filter chip FC with the mesh MSH is combined with a grid GRD that is formed in a bottom layer of the carrier board CB. In this case, the carrier board CB needs to have a multilayer structure such that each of the layers of the carrier board may be structured separately. The grid GRD covers the sound opening SO and provides third holes of a diameter that is greater than the diameter of the first holes in the mesh MSH of the filter chip FC. The grid GRD is used to filter out large particles in a first stage where the mesh MSH filters out particles a having lower diameter. The filter chip FC can be arranged in a recess on the top surface of the carrier board CB but may also be mounted on the top surface to cover the sound opening.

Further, the grid GD may be formed in a layer of the carrier board that is not the bottom layer. It is advantageous that a sufficient distance is kept between grid GRD and mesh MSH.

Figure 7:
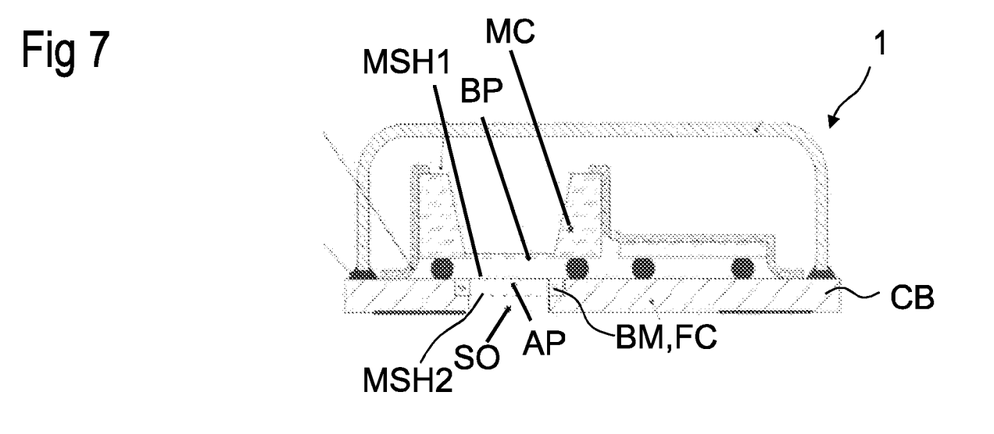
FIG. 7 shows in a cross sectional view State of the art bottom port MEMS microphone with a two-stage filter chip integrated into carrier board

FIG. 7 shows a further embodiment of an inventive MEMS microphone 1 wherein a two-stage filtering is enabled by the filter chip FC. For this purpose the filter chip FC comprises a first mesh MSH1 arranged on top of the filter chip and a second mesh MSH2 arranged on the bottom surface of the filter chip FC. Compared to the two-stage filtering of the embodiment of FIG. 6, the second mesh of the microphone of FIG. 7 may have a finer second mesh than the grid of FIG. 6. In this case it is preferred that the filter chip FC is arranged in a recess of the carrier board such that sufficient distance is kept between the upper or first mesh MSH1 and the backplate BP. The relation of the hole diameters of first and second mesh (and of grid GRD) may be chosen to achieve a maximum filter effect.

Figure 8:
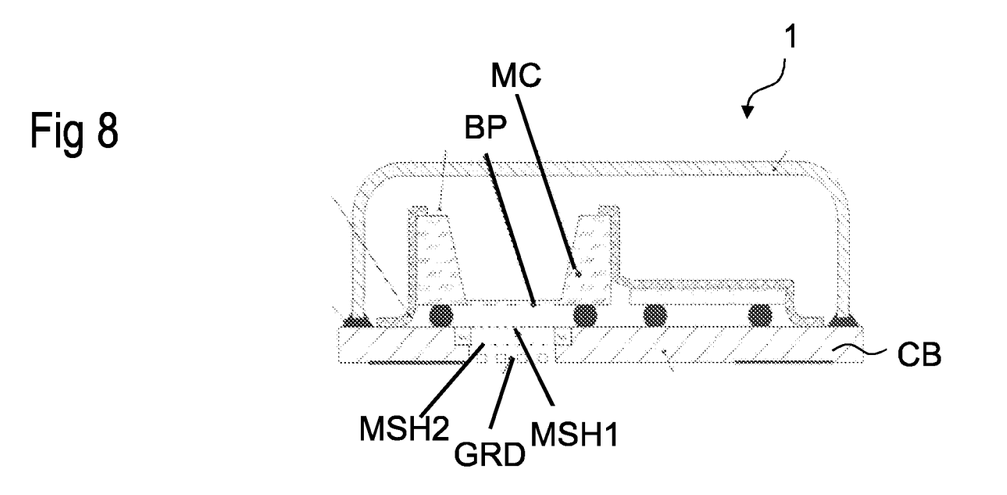
FIG. 8 shows in a cross sectional view State of the art bottom port MEMS microphone with a two-stage filter chip and an additional rough grid integrated in the carrier board

FIG. 8 shows a further advanced MEMS microphone 1 with three-stage filtering. Three stages of filtering are achieved by a combination of the embodiments of FIG. 6 and FIG. 7. A filter chip FC having a first and a second mesh MSH1/MSH2 is combined with a grid GRD formed in a layer of the multilayer carrier board CB. Here, three different diameters of openings/holes in grid, first and second mesh, are chosen such that the hole diameter is greatest at the grid at the bottom and smallest at the top mesh MSH1.

FIGS. 9A to 9D show a manufacturing process of a filter chip FC in a cross-sectional view where every figure of FIGS. 9A to 9D shows the filter chip at a respective manufacturing stage that is after a respective step.

Figure 9A:
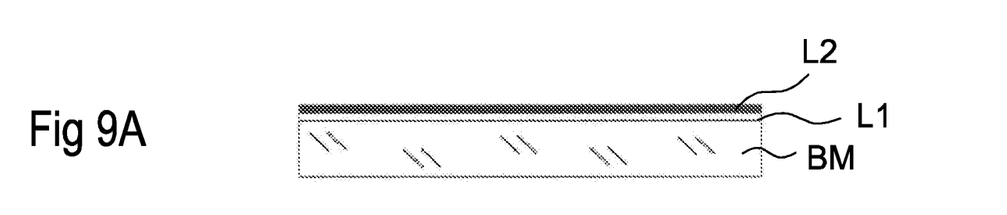
FIG. 9A to 9D show in a cross sectional view a process sequence for single mesh filter chip

FIG. 9A shows a solid filter chip (bulk material BM) that may be a crystalline silicon chip. On top of the bulk material BM of the filter chip a first layer L1 of silicon oxide, for example, and thereon a second layer L2 of silicon nitride, for example, is deposited. A thickness of the filter chip is sufficient to provide the necessary mechanical stability. The first layer L1 of silicon oxide functions as an etch-stop layer for the second layer L2 of silicon nitride the later mesh is formed of. Hence, a thickness of the second silicon nitride layer L2 complies with the desired thickness of the later mesh mesh.

Figure 9B:
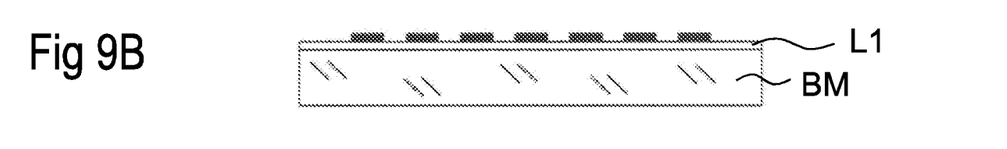

FIG. 9B shows the second layer L2 made of silicon nitride after a structuring step where first holes are etched into the second layer L2. The holes are of the desired diameter of the first mesh MSH1 and are arranged in parallel preferably in a regular pattern. Structuring may be done with the aid of a photoresist mask and a useful structuring method like plasma etching or wet chemical etching.

Figure 9C:
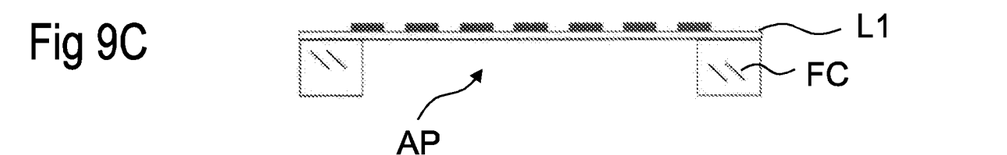

In the next step, an aperture AP is formed in the filter chip FC from the surface opposite to the mesh. When using reactive ion etching (DRIE) the silicon oxide layer L1 can be used as an etch stop. FIG. 9C shows the arrangement after the etching step.

Figure 9D:
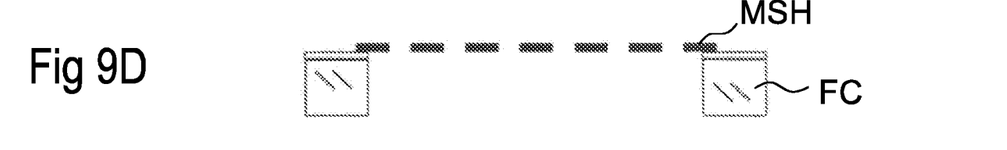

In the next step the etch-stop silicon oxide layer (first layer L1) is removed by reactive ion etching from the bottom side or by wet etching alternatively. FIG. 9D shows the arrangement after removal of layer L1 to expose the mesh from the bottom. The silicon nitride layer L2 with the regular hole pattern now forms the mesh MSH spanning over the aperture AP of the filter chip FC. Embodiments of the thus completed filter chip FC are shown in a top view in FIGS. 4 and 5 for example. But the filter chip FC may have any other shape. However, the aperture AP has preferably a round shape.

Figure 10A:
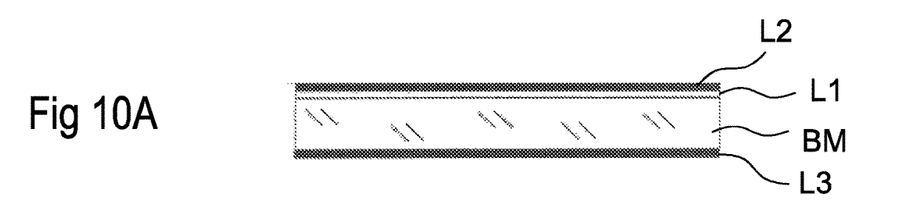
FIG. 10A to 10F show in a cross sectional view a process sequence for dual mesh filter chip

FIG. 10A to FIG. 10F show different steps of manufacturing a two-stage filter chip FC having a first and a second mesh MSH. The method starts with a chip of a bulk material BM, preferably a silicon chip. On the top side of the silicon chip a first layer L1 of silicon oxide and a second layer L2 of silicon nitride L2 are deposited as already shown with reference to FIG. 9A. On the bottom side of the filter chip FC, respectively on the bottom side of the chip of bulk material BM, a third layer L3 of silicon nitride is deposited. FIG. 10A shows the arrangement at this stage.

Figure 10B:
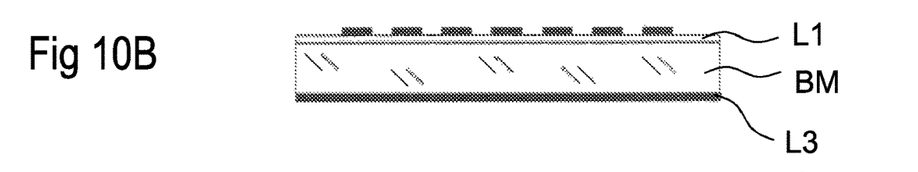

In the next step the second layer L2 of silicon nitride is structured like already shown in FIG. 9B, for example. The first layer of silicon oxide L1 functions as an etch stop when using reactive ion etching. FIG. 10B shows the arrangement at this stage.

Figure 10C:
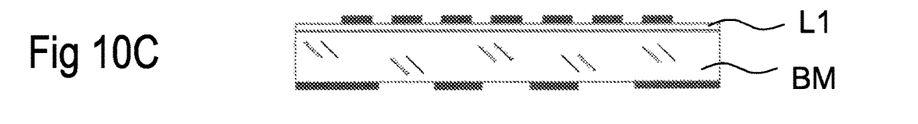
Figure 10D:
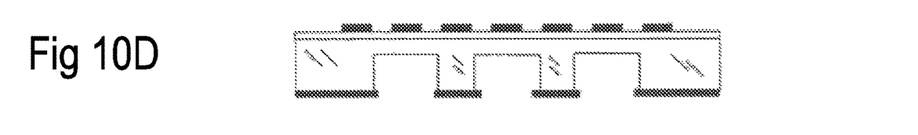

In the next step, the third layer L3 of silicon nitride on the bottom side of the bulk material chip BM respectively the filter chip, is structured to form a regular pattern of holes therein. All holes in the third layer L3 are of the same diameter that is greater than the diameter of the holes in the second layer of silicon nitride L2. FIG. 10C shows the filter chip FC with the two structured silicon nitride layers L2 and L3 that comply with the later meshes of the filter chip.

Figure 10E:
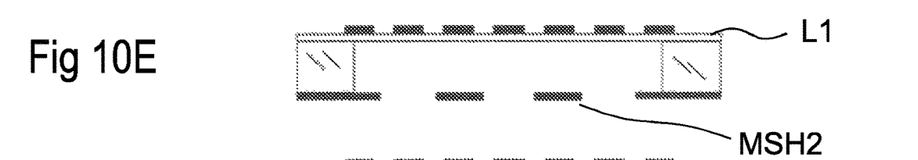
Figure 10F:
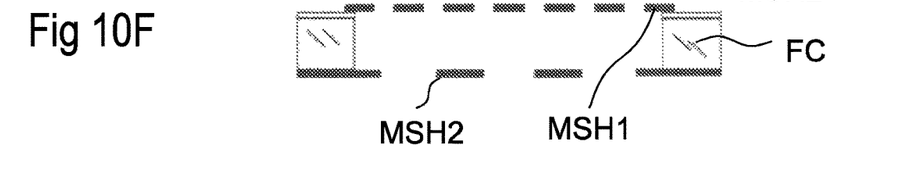

In the next step the filter chip is etched from the bottom side using reactive ion etching (DRIE) through the openings in the third layer L3 of silicon nitride. As reactive ion etching works anisotropically, it needs a second step of isotropic etching to completely etch and remove the cavity between the first layer of silicon oxide and the third layer of silicon nitride. This can be done by wet etching or by an isotropic plasma etching. FIG. 10E shows the filter chip with the thus completed cavity between the two meshes. The first layer L1 of silicon oxide remains as an etch stop and has to be removed in a further step. FIG. 10F shows the so completed filter chip with first mesh MSH1 and second mesh MSH2 on opposing surface sides of the filter chip FC. Both meshes span over the aperture AP of the filter chip so that passing the filter chip means passing first and second holes in first and second mesh MSH1 and MSH2.

Figure 11:
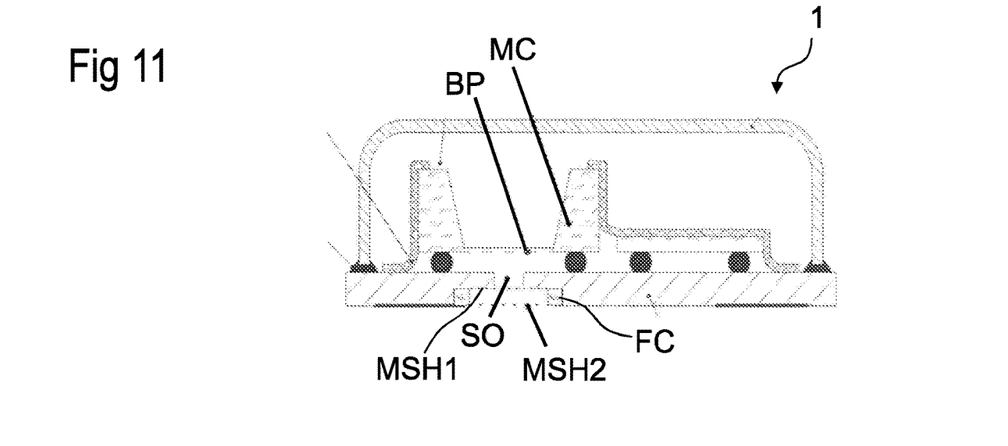
FIG. 11 shows in a cross sectional view a state of the art bottom port MEMS microphone with double mesh/filter chip integrated into the carrier board at its bottom side

FIG. 11 shows another embodiment of a MEMS microphone 1 according to the invention. The structure of this microphone is similar to the microphone as shown in FIG. 7. The main difference is the arrangement of the filter chip that is here buried in a recess in the bottom surface of the carrier board CB. The recess has a diameter greater than the diameter of the sound opening SO. The sound opening is completely closed by the two meshes of the filter chip FC. The second mesh MSH2 with the holes of the greater diameter is oriented to the bottom side while the first mesh MSH1 with the smaller hole diameter faces the MEMS chip MC arranged above the sound opening SO.

Figure 12:
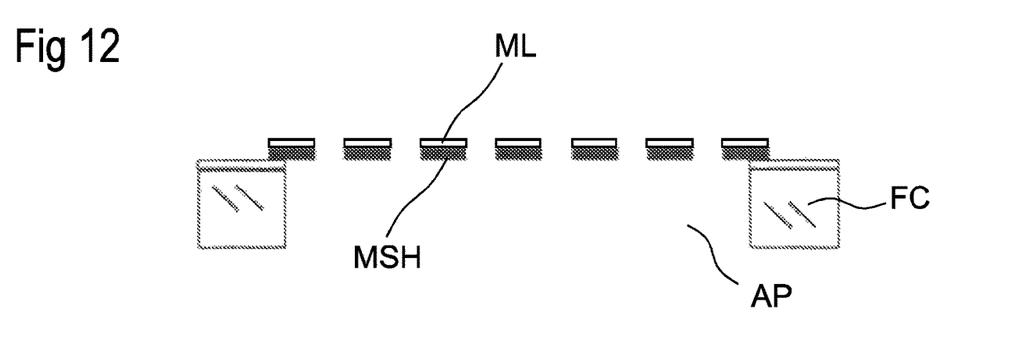
FIG. 12 shows in a cross sectional view a filter chip with improved ESD shielding

FIG. 12 shows a schematic cross-section of a filter chip FC according to a further embodiment of the invention. A metal layer ML is deposited on top of the mesh MSH or on top of one of the meshes of the filter chip FC. Thereby improved ESD and EMI protection is achieved. The metal layer ML can be deposited in a last step after finishing the filter chip as shown in FIG. 9D or 10F, for example. The deposition can comprise sputtering of a metal layer that may be reinforced galvanically or that can completely be deposited by sputtering.

If the filter chip comprises two meshes MSH the metal layer ML is preferably deposited on the mesh that faces away from the MEMS chip. To complete the ESD/EMI protection shield, the metal layer has to be contacted with a ground potential of the MEMS microphone on the carrier board CB. The contact can be achieved by using an electrically conductive adhesive for mounting the filter chip on or in the carrier board.

Figure 13:
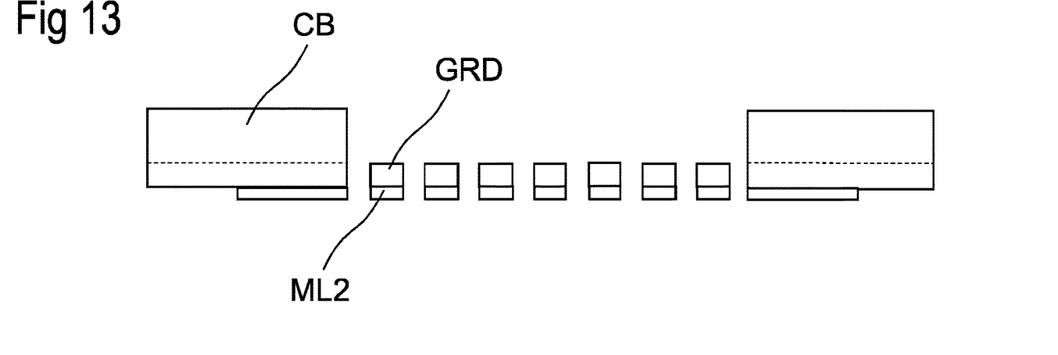
FIG. 13 shows in a cross sectional view a carrier board with improved ESD shielding.

FIG. 13 shows in a schematic cross-section through an only partly depicted carrier board CB around the sound opening SO a second metal layer ML2 that is deposited from the bottom of the carrier board to the grid GRD structured in the bottom layer of the carrier board CB to span over the sound opening SO. In this embodiment the second metal layer ML has to be structured to avoid a shorting of the contact pads D on the bottom surface of the carrier board CB. In this embodiment the mesh has also to be grounded and hence contacted to a ground potential in the form of a contact pad that is on ground potential.

Similar to the metal layer on the mesh MSH, a hydrophobic layer can be applied to one of the meshes MSH. Such a hydrophobic layer (not shown in the figure) can prevent moisture from passing through the filter chip and the mesh respectively. Preferably, the hydrophobic layer is applied on the total surface (i.e. on all mesh sides) of the mesh MSH that is next to the MEMS chip MC. The hydrophobic layer may comprise a hydrophobic film made of a fluorinated polymer.

The invention has been explained with reference to some embodiments only, but is not restricted to the embodiments as shown in the figures. The structure of the microphone as well as the housing and the arrangement of the ASIC can be designed in any other way. Important for the invention is only the filter chip closing the sound channel by spanning over the sound opening in the carrier board.

LIST OF REFERENCE SYMBOLS

1 MEMS microphone
AP aperture of filter chip
AS acoustic seal
BM bulk material of filter chip
BP backplate
BV back volume
CB carrier board
FC filter chip
FV front volume
GRD grid
L1,L2 first and second layer on the filter chip
MB membrane
MC MEMS chip
ML metal layer
MSH1, MSH2 first and second mesh
PD contact pads
RC recess in MEMS chip
SCH ASIC (semiconductor chip)
SO sound opening

The invention claimed is:

1. MEMS microphone comprising
a carrier board
a MEMS chip mounted on the carrier board and having a recess,
a membrane and a backplate, both suspended over the recess
a sound opening in the carrier board facing the backplate
a filter chip comprising a bulk material with an aperture that is covered by a mesh, the mesh comprising a layer of the filter chip with parallel through-going first holes structured in the layer, the filter chip being arranged in or on the carrier board in front of the MEMS chip such that the mesh covers the sound opening.

2. The MEMS microphone of claim 1,
wherein the mesh is structured from a layer of a thickness of less than 2 µm.

3. The MEMS microphone of claim 1,
wherein the first holes have a diameter of 0.5-20 µm.

4. The MEMS microphone of claim 1,
wherein the filter chip comprises a second mesh structured in a second layer arranged on a surface opposite to the first mesh and spanning over the aperture with parallel through-going second holes,
wherein the diameter of the first holes in the first mesh that faces the backplate is smaller than the diameter of the second holes facing away from the backplate.

5. The MEMS microphone of claim 4,
wherein the carrier board comprises a grid structured in a layer of the carrier board and spanning over the sound opening at a position below the filter chip and facing away from the MEMS chip,
wherein the grid comprises third holes having a diameter greater than the diameter of first and second holes.

6. The MEMS microphone of claim 5,
wherein the first diameter is between 0.5 µm and 5 µm,
wherein the second diameter is between 5 µm and 20 µm,
wherein the thickness of the first mesh is between 0.10 µm and 2.0 µm.

7. The MEMS microphone of claim 6,
wherein the thickness of the second mesh is between 0.50 µm and 5.0 µm.

8. The MEMS microphone of claim 4,
wherein the surfaces of first and/or second mesh comprises a hydrophobic layer.

9. The MEMS microphone of claim 1,
wherein the filter chip is arranged in the sound opening of the carrier board or on top of the carrier board.

10. The MEMS microphone of claim 1,
wherein the top surface of first or second mesh comprises a metal layer electrically connected to a ground connection of the carrier board.

11. MEMS microphone, comprising:
a carrier board;
a MEMS chip mounted on the carrier board and having a recess;
a membrane and a backplate, both suspended over the recess;
a sound opening in the carrier board facing the backplate;
a filter chip including a bulk material with an aperture that is covered by a mesh, the mesh having a layer of the filter chip with parallel through-going first holes structured in the layer, the filter chip being arranged in or on the carrier board such that the mesh covers the sound opening, and
wherein the filter chip further includes a second mesh structured in a second layer arranged on a surface opposite to the first mesh and spanning over the aperture with parallel through-going second holes.

12. MEMS microphone comprising a carrier board;
a MEMS chip mounted on the carrier board and having a recess;
a membrane and a backplate, both suspended over the recess;
a sound opening in the carrier board facing the backplate;
a filter chip including a bulk material with an aperture that is covered by a mesh, the mesh having a layer of the filter chip with parallel through-going first holes structured in the layer, the filter chip being arranged in or on the carrier board such that the mesh covers the sound opening,
wherein the filter chip further includes a second mesh structured in a second layer arranged on a surface opposite to the first mesh and spanning over the aperture with parallel through-going second holes,
wherein the diameter of the first holes in the first mesh that faces the backplate is smaller than the diameter of the second holes facing away from the backplate,
wherein the carrier board includes a grid structured in a layer of the carrier board and spanning over the sound opening at a position below the filter chip and facing away from the MEMS chip, and
wherein the grid includes third holes having a diameter greater than the diameter of first and second holes.

* * * * *